United States Patent
Yu et al.

(10) Patent No.: US 7,218,516 B2
(45) Date of Patent: May 15, 2007

(54) INLET AIRFLOW GUIDING STRUCTURE FOR COMPUTERS

(75) Inventors: Wen-Lung Yu, Taipei (TW); Ray-Ming Lai, Taipei (TW)

(73) Assignee: Shuttle, Inc., Taipei (TW)

( * ) Notice: Subject to any disclaimer, the term of this patent is extended or adjusted under 35 U.S.C. 154(b) by 270 days.

(21) Appl. No.: 10/948,298

(22) Filed: Sep. 24, 2004

(65) Prior Publication Data

US 2006/0067048 A1 Mar. 30, 2006

(51) Int. Cl.
*H05K 7/20* (2006.01)
(52) U.S. Cl. .................. 361/695; 361/690; 454/184; 165/122
(58) Field of Classification Search ............. 361/695, 361/690; 454/184; 165/122
See application file for complete search history.

(56) References Cited

U.S. PATENT DOCUMENTS

| | | | | |
|---|---|---|---|---|
| 5,547,272 A | * | 8/1996 | Paterson et al. | 312/223.2 |
| 5,751,550 A | * | 5/1998 | Korinsky | 361/695 |
| 6,000,769 A | * | 12/1999 | Chen | 312/223.2 |
| 6,086,476 A | * | 7/2000 | Paquin et al. | 454/184 |
| 6,288,333 B1 | * | 9/2001 | Liu et al. | 174/563 |
| 6,296,333 B1 | * | 10/2001 | Lee et al. | 312/223.2 |
| 6,297,950 B1 | * | 10/2001 | Erwin | 361/685 |
| 6,542,362 B2 | * | 4/2003 | Lajara et al. | 361/687 |
| 6,919,816 B2 | * | 7/2005 | Dearborn et al. | 340/815.45 |
| 2002/0190868 A1 | * | 12/2002 | Dearborn et al. | 340/691.1 |
| 2006/0050480 A1 | * | 3/2006 | Yu et al. | 361/687 |

* cited by examiner

*Primary Examiner*—Anatoly Vortman
(74) *Attorney, Agent, or Firm*—Birch, Stewart, Kolasch & Birch, LLP

(57) ABSTRACT

An inlet airflow guiding structure for a computer includes a computer chassis, a front bezel, an airflow guiding space defined between the front bezel and the computer chassis, and a plurality of inlet airflow openings. The airflow guiding space and the inlet airflow openings provide a low airflow impedance inlet that facilitates the movement of the incoming inlet airflow. The front cooling fan in the computer is thereby capable of providing lower-temperature air into computer for efficiently dissipating heat generated for high-speed CPU.

2 Claims, 5 Drawing Sheets

INLET AIRFLOW GUIDING STRUCTURE FOR COMPUTERS

BACKGROUND OF THE INVENTION

The present invention relates in general to an inlet airflow guiding structure for computers, and more particularly, to an inlet airflow guiding structure utilized in a computer that complies with the Balanced Technology Extended (BTX) Interface Specification suggested by the Intel Corporation, and capable of rapidly introducing external cool air into computer to provide efficiently heat dissipating.

Various electrical instruments, especially the desktop computers, are crowded with different electrical components and peripheral devices, such as the Central Processing Unit (CPU), the interface card, the hard disk, the disk burner, and the power supply. Those electrical components and peripheral devices each generate different levels of heat during their respective operations. The CPU because of its high processing speed, in particular, generates a large amount of heat. Nonetheless, the computer case of the average desktop computer is closed. Accordingly, the inner temperature of a desktop computer is very high. Therefore, one or more heat dissipation modules are installed inside the computer chassis to remove the heat generated by the electrical components and peripheral devices. The removal of this generated heat helps to ensure that the inside of the computer case maintains a moderate operating temperature.

Conventional heat dissipation system for desktop computers nowadays has a circular opening bored in its rear plate and a corresponding cooling fan installed in that circular opening. Further, some heat dissipating modules are comprised of modules that have a heat dissipating fin and cooling fan assembled onto a high temperature electrical component. This conventional heat dissipation system is barely able to complete its work. Heat dissipation is also hindered in the conventional arts because the exhaust airflow is hindered by internal electrical components. The inner airflows created by the conventional heat dissipating system interfere with each other. This happens when some of the heated air is re-circulated into the cooling fan which is assembled on an electrical component. Some heated air re-circulates into the cooling fan assembled on an electrical component, and therefore reduces the heat transfer capability of the heat dissipating module. Furthermore, the electrical components and peripheral devices will continue to evolve and new components will need to be integrated with the desktop computer. The current heat dissipation system is unable to satisfy the future demand of a new generation of computer systems.

Moreover, according to the modern computer system, the large amount of heat generated from CPU because of the higher speed is still an unsolved problem in heat dissipating area.

BRIEF SUMMARY OF THE INVENTION

The present invention provides an inlet airflow guiding structure for computers so as to solve heat dissipating problem of high-speed CPU in modern computer system.

Accordingly, the inlet airflow guiding structure of the present invention including an airflow guiding space defined between the front bezel and the computer chassis, and a plurality of inlet airflow openings can provide a low airflow impedance inlet that facilitates the movement of the incoming inlet airflow. Therefore, as the computer uses a front-to-back airflow disposition which has a front cooling fan installed at the front panel of the computer chassis, the front cooling fan is capable of providing lower-temperature air into computer for efficiently dissipating heat generated for high-speed CPU. Furthermore, it is unnecessary to bore a large diameter airflow opening on the front bezel, which would spoil the attractive appearance of a computer.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

These as well as other features of the present invention will become more apparent upon reference to the drawings therein.

DETAILED DESCRIPTION OF THE INVENTION

Figure 1:
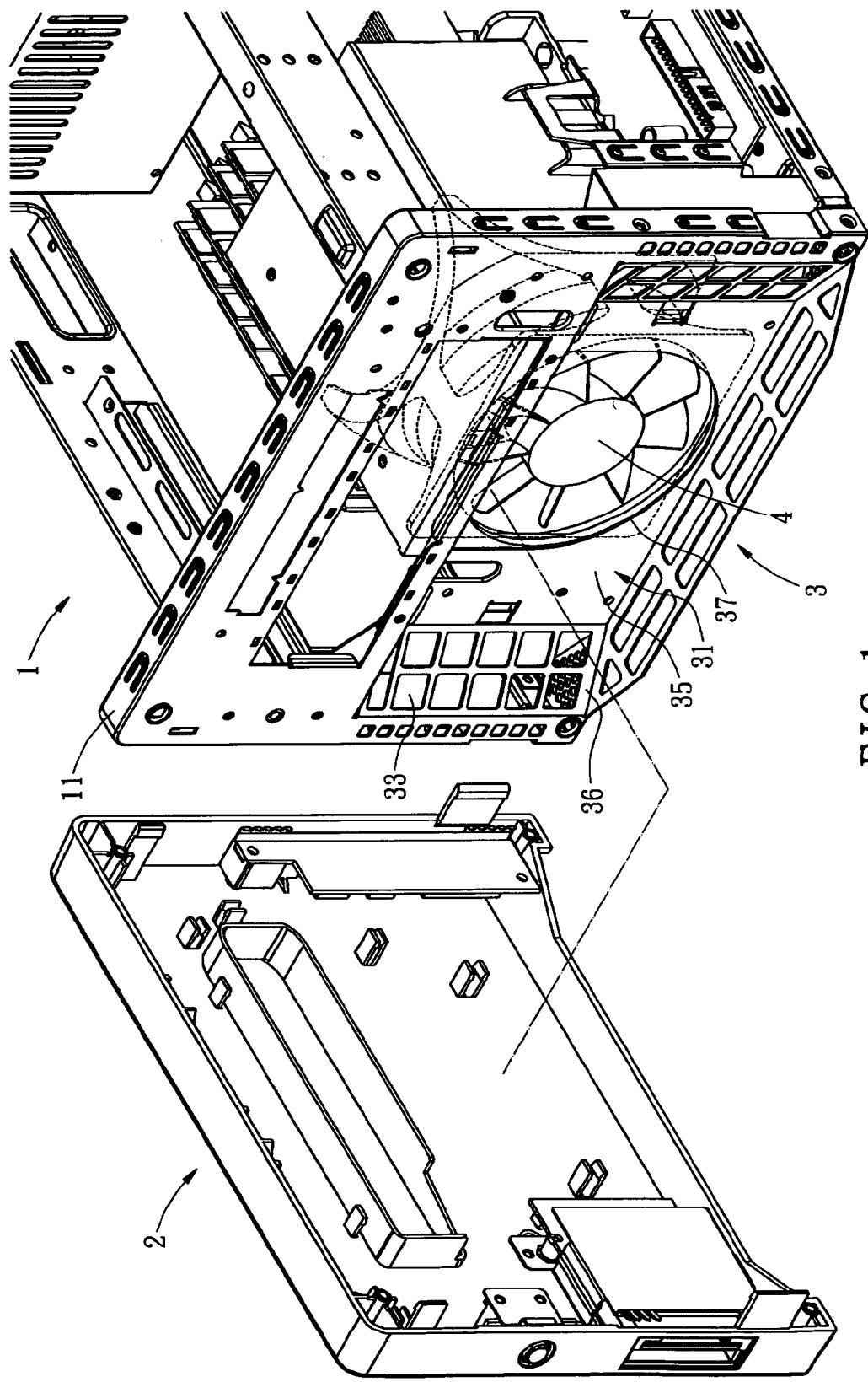
FIG. 1 is a perspective view of one embodiment of the present invention before installation.
Figure 2:
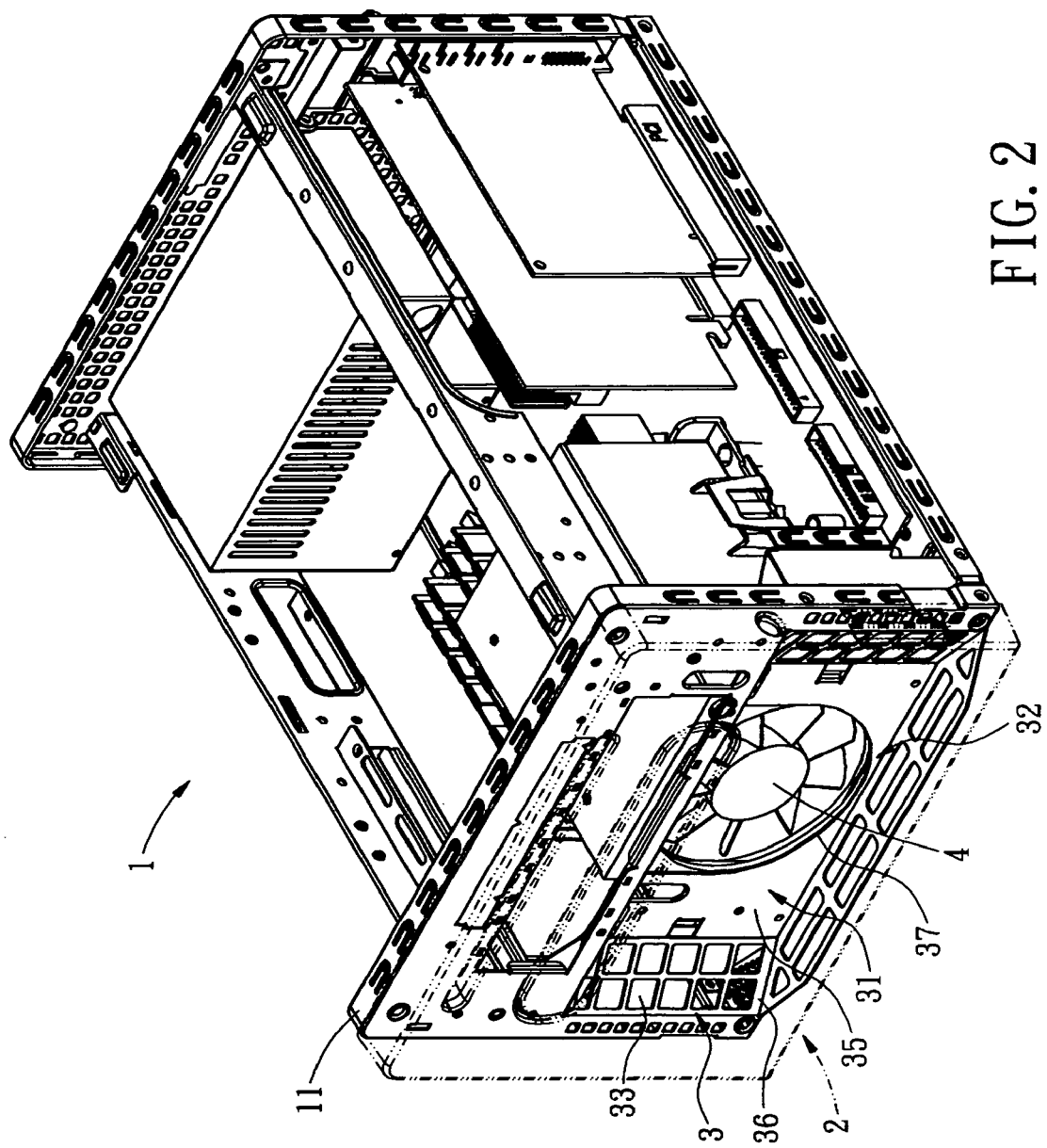
FIG. 2 is a partial perspective view of the present invention after installation.

Reference will now be made in detail to the preferred embodiments of the present invention, examples of which are illustrated in the accompanying drawings. Wherever possible, the same reference numbers are used in the drawings and the description to refer to the same or like parts.

Referring to FIGS. 1 though 5, an inlet airflow guiding structure for computers according one preferred embodiment of the present invention is illustrated. The inlet airflow guiding structure 3 includes a computer chassis 1, a front bezel 2 which connects to the computer chassis 1, an airflow guiding space 32, and a plurality of inlet airflow openings 33. The computer provides a front-to-back airflow disposition by utilizing a front cooling fan 4 which is installed at the front panel 11 of the computer chassis 1. This front-to-back airflow disposition complies with the BTX specification suggested by the Intel Corporation.

The inlet airflow guiding structure of the present invention enables the external lower-temperature air to pass through the inlet airflow openings 33 into the airflow guiding space 32, and further be drawn by the cooling fan 4 into the computer chassis 1. The airflow guiding space 32 and the inlet airflow openings 33 provide a low airflow impedance inlet, which facilitates the movement of the entering airflow stream, and thereby able to supply the desktop computer with an affluent airflow stream. The front cooling fan 4 is thereby capable of providing the high power components of the computer motherboard with lower-temperature air at a high velocity. Further, it is unnecessary for the present invention to bore a large diameter airflow opening on the front bezel 2, which would spoil the attractive appearance of a computer.

The computer chassis 1 has a large diameter opening 37 bored on the front panel 11 thereof. The large diameter opening 37 corresponds with the front cooling fan 4, and enables the cooling fan 4 to acquire sufficient lower-temperature air from the airflow guiding space 32 which is defined between the front bezel 2 and the front panel 11 of the computer chassis 1.

The front panel 11 of the computer chassis 1 has a recess 31. The recess 31 includes a bottom surface 35 and three sidewall surfaces 36. The angle between the bottom surface 35 and the sidewall surface 36 may be an obtuse angle, a right angle, or an acute angle. The inlet airflow openings 33 are formed on the sidewall surfaces of the front panel 11 of the computer chassis 1.

Figure 3:
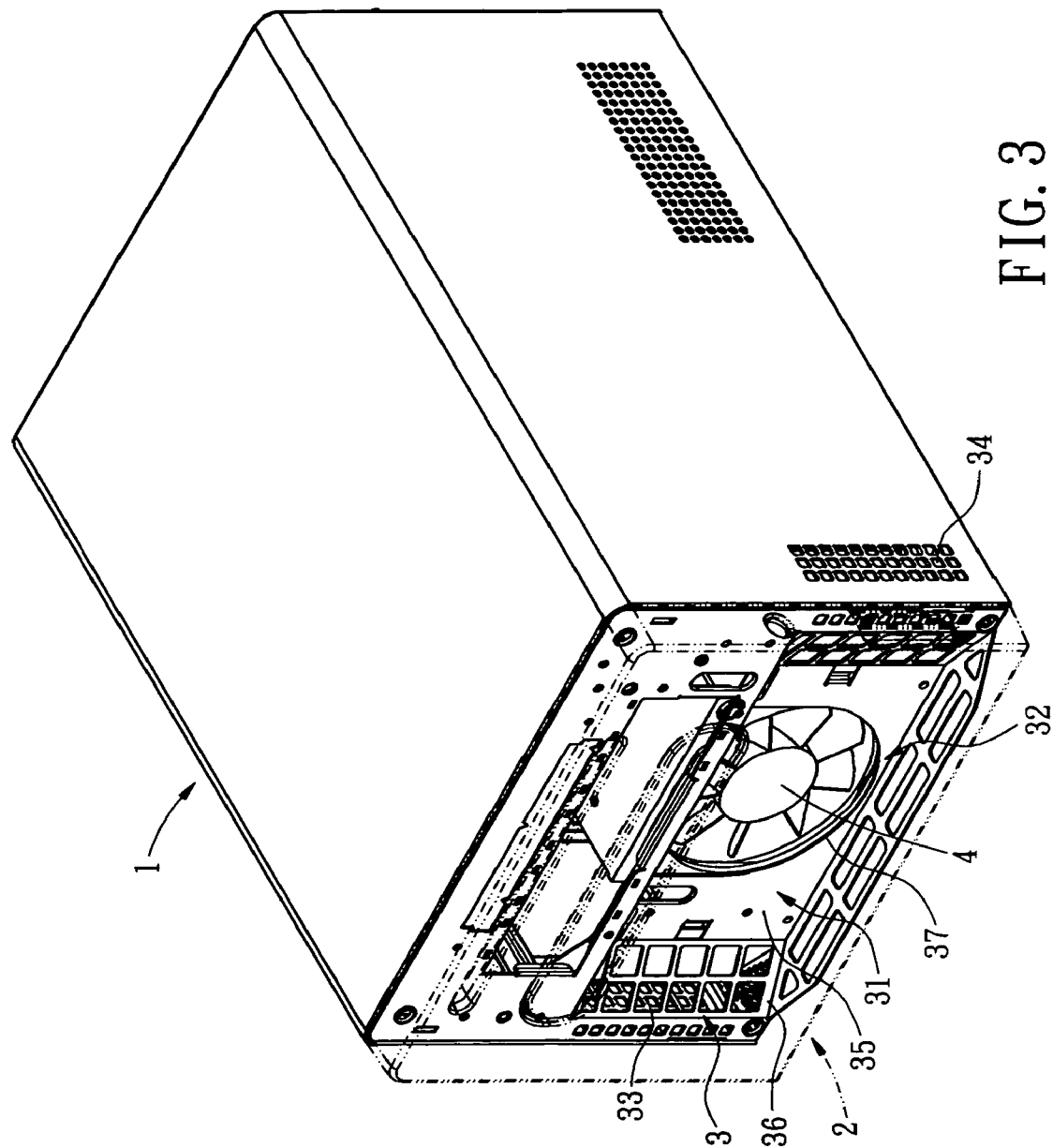
FIG. 3 is a perspective view of the present invention after installation.
Figure 4:
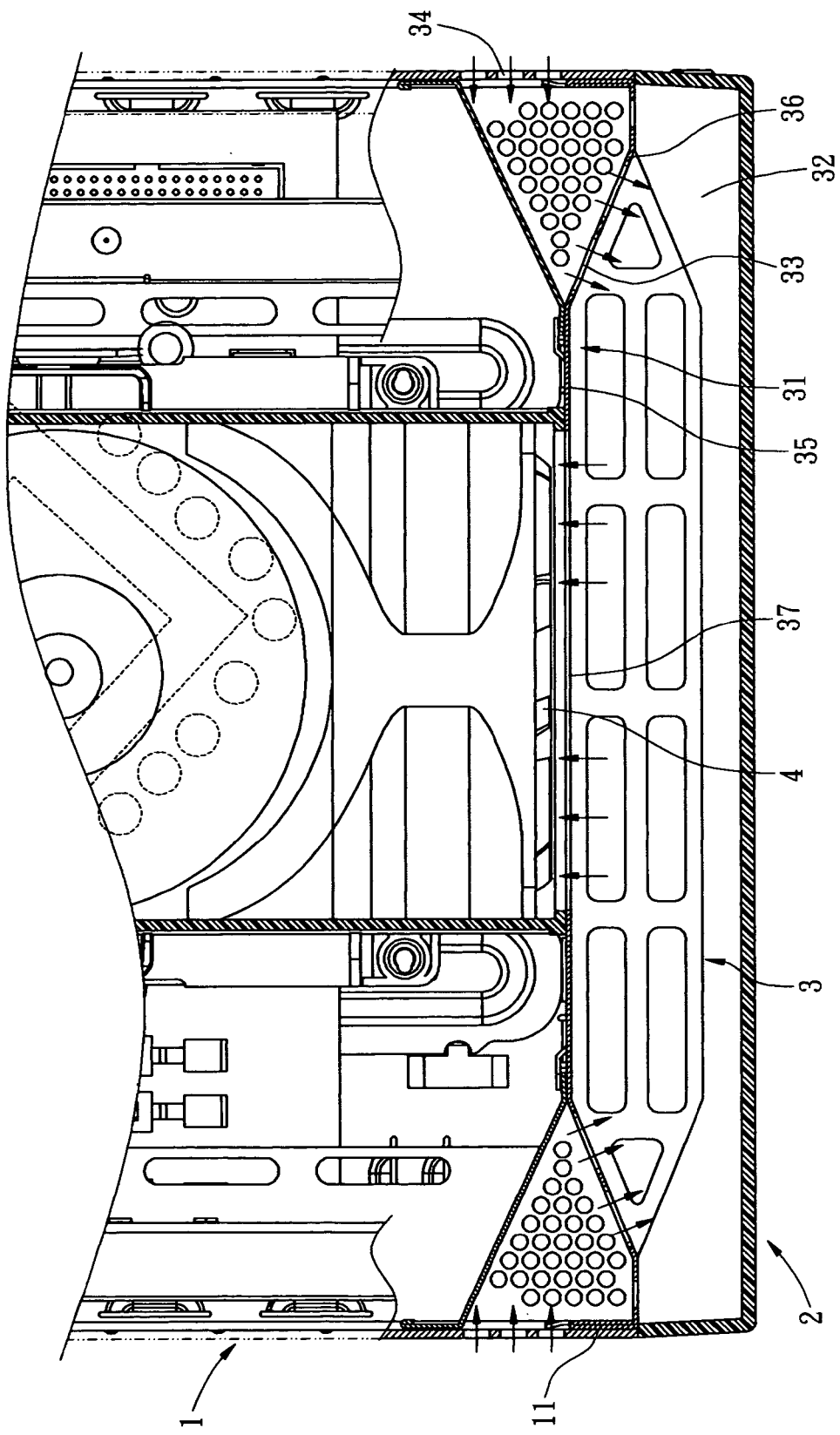
FIG. 4 is a cross-sectional view from the top of the present invention in FIG. 3.
Figure 5:
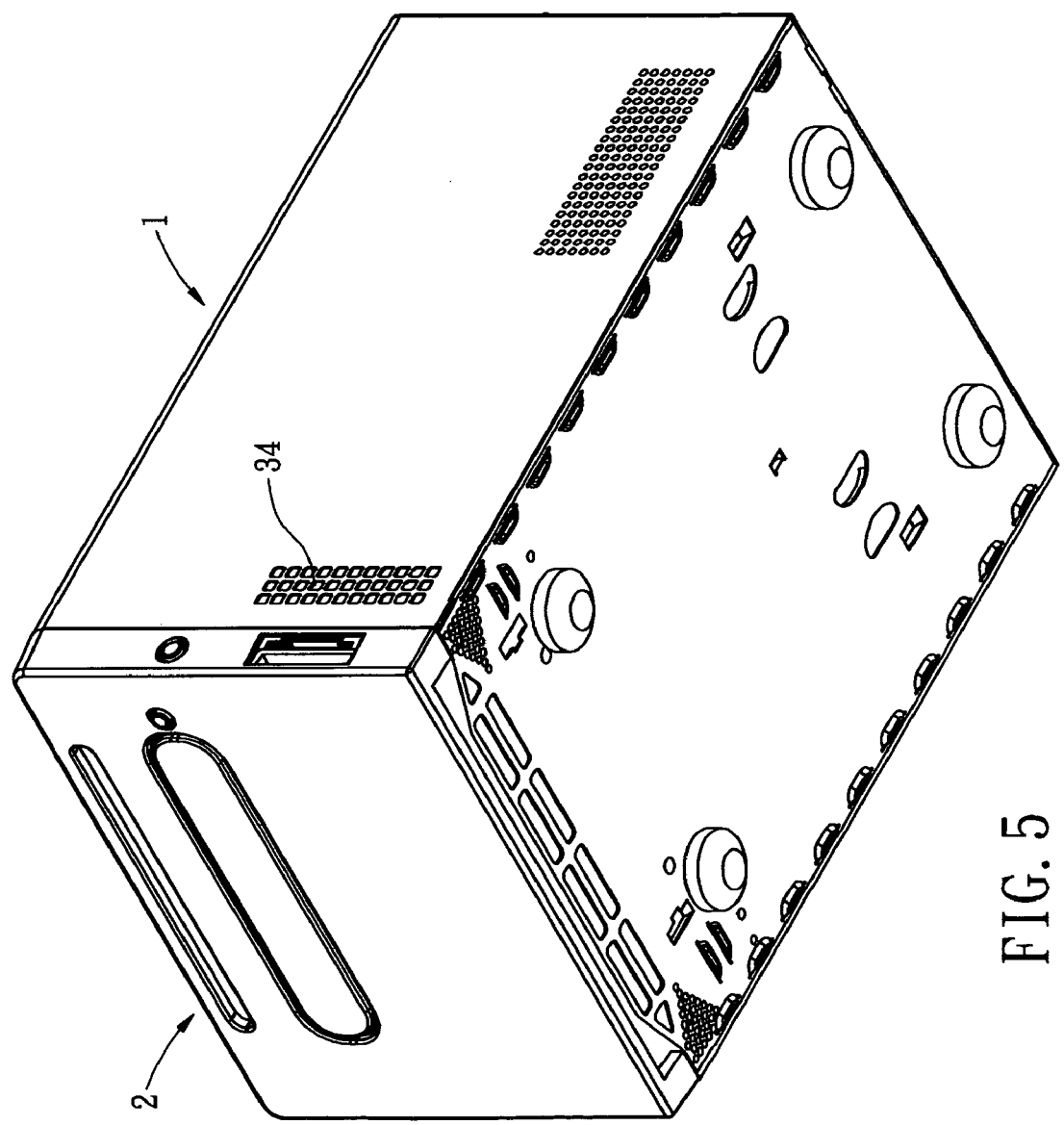
FIG. 5 is a perspective view from the bottom of the present invention in FIG. 3.

After a cover casing is mounted to the computer chassis 1 as shown in FIGS. 3 and 5, another plurality of inlet airflow openings 35 are formed on the side plate thereof. These disposition of the inlet airflow openings 33, 34 provides the cooling fan 4 with multi directional input sources for a surrounding type of inlet airflow. Therefore, via the first and the second inlet airflow openings 33, 34 respectively formed on the front plate 11 of the chassis 1, and the cover casing, when the cooling fan 4 is operated, the cooling air outside the computer can be efficiently drawn into the airflow guiding space 32 to be used to dissipate heat generate from CPU of the computer.

While an illustrative and presently preferred embodiment of the invention has been described in detail herein, it is to be understood that the inventive concepts may be otherwise embodied and employed and that the appended claims are intended to be construed to include such variations except insofar as limited by the prior art.

What is claimed is:

1. An inlet airflow guiding structure for a computer, comprising:
    a computer chassis having a front panel with a recess formed thereon, the recess including a bottom surface and two sidewall surfaces;
    a cover casing mounted on the computer chassis with a plurality of first inlet airflow openings formed on a front end thereof;
    a cooling fan installed in the recess;
    a front bezel connecting to the computer chassis;
    an airflow guiding space defined between the front bezel and recess; and
    a plurality of second inlet airflow openings formed on the sidewall surfaces, which allow external air from the first inlet airflow openings to flow into the computer through the airflow guiding space to provide a front-to-back airflow driving by the cooling fan.

2. The structure of claim 1, wherein an angle between the bottom surface and the sidewall surface is an obtuse angle. angle, or an acute angle.

* * * * *